United States Patent [19]

Segal

[11] Patent Number: 4,555,672

[45] Date of Patent: Nov. 26, 1985

[54] HIGH-FIDELITY AUDIO FREQUENCY AMPLIFIER

[76] Inventor: Brahm R. Segal, 4265 Carlton Ave., Montreal, Quebec, Canada

[21] Appl. No.: 552,818

[22] Filed: Nov. 17, 1983

[51] Int. Cl.⁴ .............................................. H03F 3/30
[52] U.S. Cl. ................................... 330/255; 330/265; 330/266; 330/268
[58] Field of Search ............... 330/255, 263, 265, 266, 330/267, 268

[56] References Cited

PUBLICATIONS

Oberhaus, "HiFi-Stereo-Endverstärker", *Funkschau,* 14/1981, pp. 58-61.

Schmidt, "Current Dumping Amplifier", *Elektor,* Jul.-/Aug. 1979, pp. 7-37.

Terrell, "Linear Power Amplifier", *IBM Technical Disclosure Bulletin,* vol. 21, No. 3, Aug. 1978, pp. 1226-1227.

*Primary Examiner*—James B. Mullins
*Attorney, Agent, or Firm*—Edward A. Sokolski

[57] ABSTRACT

A high frequency audio amplifier in which the positive and negative bias ports of an operational amplifier are employed to drive two oppositely phased current mirror circuits. Additionally, the outputs of the current mirror circuits are current regulated in terms of the number of base emitter voltage drops in power amplifier circuitry following the current mirrors. Further, the output stage employs parallel connected radio frequency type transistors.

9 Claims, 3 Drawing Figures

HIGH-FIDELITY AUDIO FREQUENCY AMPLIFIER

TECHNICAL FIELD

This invention relates generally to audio frequency amplifiers, and particularly to a transformerless, high-fidelity, audio frequency amplifier.

BACKGROUND ART

There have been tremendous advances in the past 10 years or so in the design of high-fidelity audio frequency amplifiers, and some might say that near perfection has already been achieved. However, it seems that with each increment of improvement, new flaws are discovered, often not noticed until previously observed ones have been eliminated.

Perhaps one of the principal remaining areas of imperfection lies in the inability of perhaps most amplifiers to preserve at the output the precise time relationship between sounds of different frequencies which are embodied in the input signal to the amplifier. An excellent example of the problem is that of reproducing the fundamental and all of the harmonically related components coming from a musical instrument without some discrepancy in time of reproduction of the multitude of frequencies present (group delay).

It is the object of this invention to provide an amplifier which reduces the group delay in the time domain and in general improves the quality of reproduction and has a very large phase margin at the output stage.

SUMMARY OF THE INVENTION

In accordance with this invention, an input signal is first amplified in voltage by an operational amplifier. The signal is separated into positive and negative signal components for further and balanced amplification without the requirement of a separate phase inversion stage. This is accomplished by using the ± bias ports of the operational amplifier as 180° phase reversed signal output sources. The positive port drives a positive polarity current amplification mirror, and the negative port drives a negative polarity current amplification mirror. The thus derived two, oppositely phased, current signals are then subjected to current regulation precisely in terms of the base emitter junction which the signal must traverse thereafter in the amplifier. In this way, temperature variations which effect each junction may be summed in effect and compensated for, whereby variations in base-emitter junction impedance with temperature which may greatly affect the operating point of an amplifier are precisely compensated for. These and other features, as will be described, essentially eliminate time domain distortion effects currently observable with many amplifiers.

DETAILED DESCRIPTION OF THE INVENTION

Figure 1:
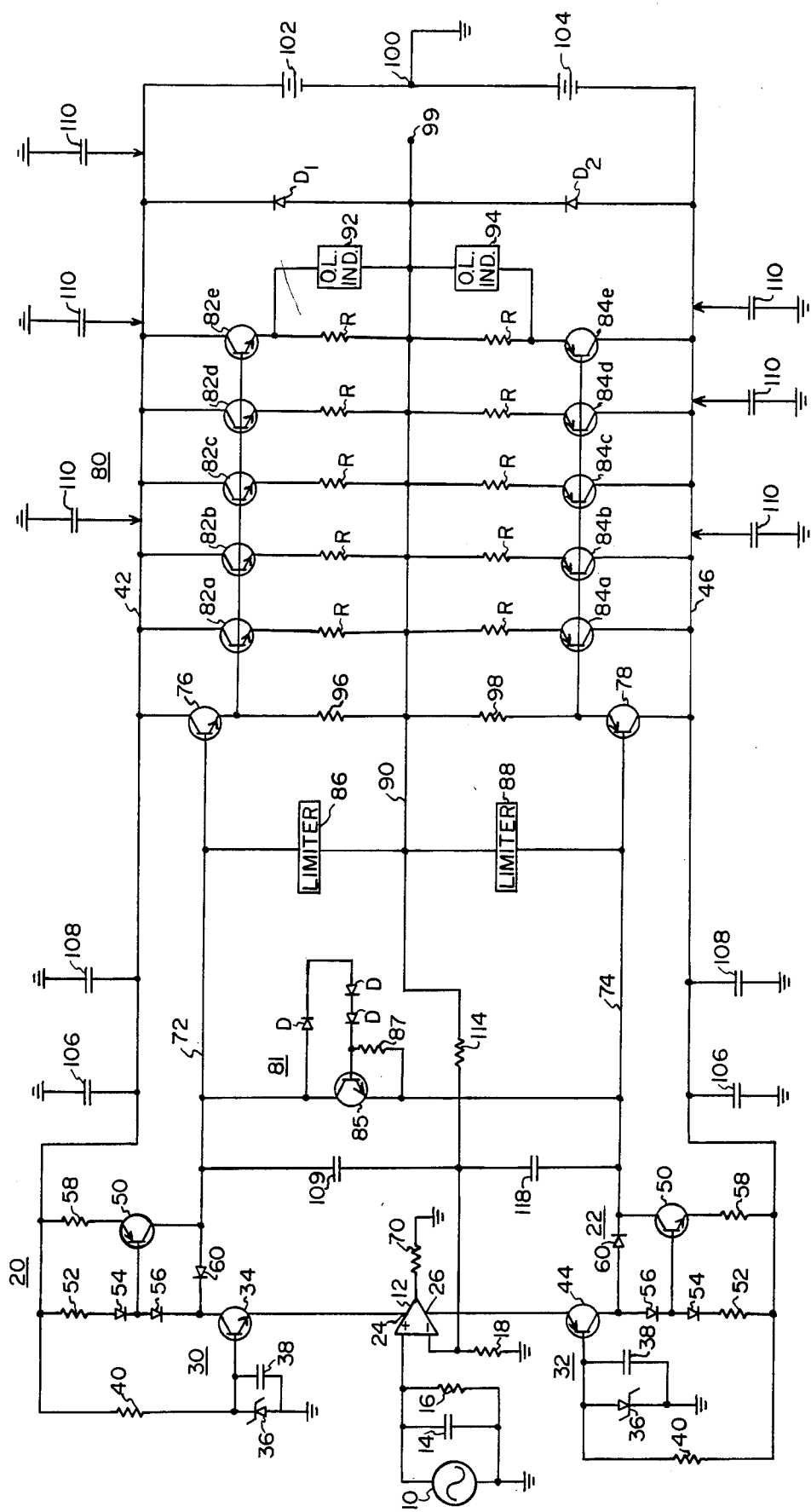
FIG. 1 ia an electrical schematic diagram of an embodiment of the invention.

Referring initially to FIG. 1, a source 10 of audio frequency signals would be applied between the positive, or non-inverting, input of operational amplifier 12 and ground across a small capacitor 14, e.g., 30 PF, and resistor 16. This resistance-capacitance combination provides a rolloff of response above about 100 KHz. The inverting input of the amplifier is connected across resistor 18 to ground. Operational amplifier 12 functions as a voltage amplifier, and the amplified voltage provides drive to current amplifiers or current mirrors 20 and 22 which mirror in terms of current the positive and negative voltage components of the input signal amplified by amplifier 12. Positive and negative components are separately provided to current amplifiers 20 and 22 by feeding an input to positive component current amplifier 20 from what would normally be the positive bias D.C. port 24 of oprational amplifier 12 and feeding an input to negative component current amplifier 22 from what would normally be the negative bias D.C. port 26 of operational amplifier 12.

In order to provide a compatibility between operating bias levels, that for operational amplifier 12 of approximately 15 volts, and that for the bias level of the balance of the amplifiers at a significantly higher level, for example, 65 volts, positive level shifter 30 is connected between positive bias port 24 of operational amplifier 12 and current amplifier 20, and negative potential level shifter 32 is connected between the negative bias port 26 and negative polarity current amplifier 22. As an example of the two, level shifter 30 employs NPN transistor 34 with its collector-emitter circuit between current amplifier 20 and operational amplifier 12 and a reference 15 volts applied to its base by virtue of a 15-volt zener diode 36, in parallel with capacitor 38, connected between ground and the base of resistor 34. The base is powered through bias resistor 40 from positive bias rail 42 (+65 volts). In this manner, the emitter of transistor 34, and thus the positive port 24 of operational amplifier 12, is held at essentially 15 volts, actually, 15 volts less the voltage drop (approximately 0.3 volt) across the base-emitter junction of transistor 34.

Level shifter 32 employs PNP transistor 44 and is coupled and operates in a like manner to that of level shifter 30 and includes like components which are like labeled. Its base is biased from negative bias rail 46 through resistor 40.

Of the two current amplifiers 20 and 22, current amplifier 20 employs PNP transistor 50, and there are two current paths between positive bias rail 42 and the collector of transistor 50, one path being via resistor 52, diode 54, and diode 56 in series, and the other being through emitter resistor 58, the emitter base circuit of transistor 50, and diode 60. With this configuration, the current amplification ratio between current through resistor 52 and the output of the circuit through resistor 58 is determined by the ratio of the values of resistor 52 (e.g., 300 ohms) and resistor 58 (e.g., 100 ohms), thus a ratio in this case of 3:1. Diode 54 is employed to provide a forward semi-conductor junction parallel to that of the emitter-base junction of transistor 50, and thus with like ambient temperatures, subject to both junctions, the voltage drops across each will be essentially identical, and thereby there is preserved the impedance ratio between the two current paths, and thus there is stabily preserved the current amplification of the amplifier.

Diode 60 is connected between the collector of transistor 50 and the collector of transistor 34, poled for forward flow in the order of this connection, and diode 56 is connected, in a forward current flow mode between the base of transistor 50 and the collector of transistor 34. The purpose of these two diodes is to insure that the voltage at the base of transistor 50 will always be of a value less than the collector voltage of transistor 50; and, in fact, by virtue of these two diodes, the voltage at the base of transistor 50 will always be less by a value of at least the sum of the forward diode voltages of these two diodes. This prevents saturation cut-off and thus distortion effects that could occur in transistor 50.

Except that current amplifier 22 is coupled through level shifter 32 between negative bias rail 46 and negative bias port 26 of operational amplifier 12 and employs an NPN transistor, and thus current flow is opposite, the connections and operation of current amplifier 22 are identical to that of current amplifier 20.

The output of operational amplifier 12 is terminated by resistor 70, its function being merely to maintain a normal load on operational amplifier 12 (e.g., 400 to 600 ohms), and it is not employed as a signal output.

The signal varying output currents of current amplifier 20 and current amplifier 22 flow through signal bus leads 72 and 74 through the base-emitter input circuits of NPN transistor amplifier 76 and PNP amplifier transistor 78, respectively, which function as drive amplifiers for power output stage 80. As a means of maintaining D.C. stability for the system and at an essentially constant operating point, a current regulator 81 is connected between signal buses 72 and 74. It employs an NPN transistor 85 conventionally (reversed biased) connected (collector-emitter) between these buses, and its impedance is regulated by a plurality of forward connected diodes D connected between bus 72 and the base of transistor 85. Resistor 87 is connected between the base and emitter of transistor 85. The function of this regulator circuit is to compensate for ambient temperature produced changes in forward current flow to transistors 76 and 78 and beyond, this being effected by the regulator providing a shunt path which would reduce the drive level with increase in temperature to thus generally maintain a constant operating level. Three diodes D and the base-emitter junction of transistor 85 are employed to stimulate four base-emitter voltages which may vary with temperatures, these being: one represented by transistor 76; one represented by transistor 78; one represented by the parallel combination of power output transistors 82a, 82b, 82c, 82d and 82e; and one represented by the voltage drops across the parallel combination of power transistors 84a, 84b, 84c, 84d and 84e.

As a further circuit protective means, voltage limiters 86 and 88 are also connected to signal buses 72 and 74, voltage limiter 86 being connected between signal bus 72 and amplifier output bus 90, and voltage limiter 88 being connected between signal bus 74 and output bus 90. These limiters prevent the voltage at the input of transistors 76 and 78 from rising above a selected value and thereby overdriving the circuitry and possibly damaging it.

As a further protective feature, diodes $D_1$ and $D_2$ are connected in a reverse direction between the positive and negative rails and output bus. This prevents a voltage swing from an inductive load (a speaker) from raising the effective voltage applied to the output stage transistors above the applied biases plus the junction voltage drops of junctions of these diodes.

As a further protective feature, selected degrees of peak operating levels are indicated by means of a pair of overload indication circuits 92 and 94, one for each polarity of the output amplifier. Basically, these would be conventional adjustable peak voltage indicators. In some instances, it may be deemed acceptable to employ only one such indicator.

It is a particular feature of this invention that all of the transistors employed are high-frequency transistors and preferably having a cut-off no lower than 10 megacycles. Further, circuit layout is in accordance with RF (radio frequency) circuitry standards whereby stray capacitances and inductances are minimized.

The power output stage 80 of the present amplifier is a balanced amplifier wherein five NPN high-frequency transistors 82a–82e are connected in parallel between positive rail 42 and output bus 90 of small value (e.g., 0.33 ohm) resistors R being connected between the emitter of each and output bus 90. Similarly, five PNP transistors 84a–84e are connected in parallel between negative rail 46 and output bus 90 through like resistors R. The base inputs of transistors 82a–82e are fed from the emitter output of transistor 76 appearing across resistor 96 connected between its emitter and output bus 90. Similarly, the base inputs of transistors 84a–84e are fed from the emitter output of transistor 78 appearing across its emitter resistor 98 connected between the emitter of transistor 78 and output bus 90. By the employment of several high-frequency parallel transistors, it is possible to hold down the total capacitance or storage effects and thereby maintain excellent high-frequency operation.

The output of power output stage 80 appears between output bus terminal 99 and ground at terminal 100, the mid point for ± bias sources 102 and 104 supply the ±65 volts to positive and negative rails 42 and 46. A loudspeaker would typically be connected across terminals 99 and 100. The power bias sources would typically comprise basic A.C. rectifier type power supplies (or a single supply), providing the ± bias voltages shown. The purity of these voltages is maintained by the employment of a plurality of filter capacitors for each polarity and the capacitors having different characteristics. Thus, in addition to having a basic high value capacitor 106, for example, of 100 MF for capacitor 106, there is also included capacitor 108 having a capacitance of 1 UF, and capacitors 110 having capacitances of 0.1 UF. Each has a low effective series resistance. The resistance in each case would be chosen such that the inverse of the R-C time constant of that capacitor would be greater than all frequencies of interest. In this manner, it has been found that the power supply is quite flat insofar as it providing a very low impedance to all amplified frequencies. Actually, as will be noted, there are several of capacitors 110 having 0.1 MF capacitance.

As will be further noted, capacitors 110 are shown connected to the collector buses, or circuit board traces 42 and 46 via an arrow which is intended to indicate that the connection points are variable. In order to locate them, input signal 10 to the circuit is varied over a frequency of 20 Hz to 20 KHz, and the effective load between output terminals 99 and 100 is varied through a range of resistive, capacitive and inductive loading thereby varying the power factor between about 0.1 and 1. When all this is done, certain combinations of frequencies and loads may generate spurious oscillations at the output of the amplifier at various output voltage levels. These will be accompanied by maximum voltage or high impedance points appearing along the collector buses 42 and 46. Then, one of the capacitors 110 is connected at each such voltage maximum point. By this system of connection, the spurious oscillations are essentially eliminated, enabling an extremely pure and stable output. As a matter of fact, the range of unaffected frequencies is easily from 10 Hz to 75 KHz.

Inverse feedback is provided from output terminal 99, back through resistor 114, and across resistor 18 to the inverting input of operational amplifier 12. Resistor 18 is approximately 1/22 of the value of resistor 114, and accordingly, this fraction of the output voltage is fed back to the inverting input of operational amplifier 12. By virtue of the essentially absolute voltage-to-current mirror effect of the current amplifiers with respect to the voltage outputs of operational amplifier 12, there is a negligibly small phase shift between operational amplifier 12 and the output of the amplifier. This enables a high degree of inverse feedback employed without the occurrence of instability. This, of course, enables the concurrent quite high effective damping effect on a speaker connected to the output of the amplifier to thus provide a very precise control of the speaker. The increased ability to provide higher inverse feedback also, of course, generally enables a lower distortion output of the amplifier.

As a further feature of the applicant's amplifier, small, 30 PF, inverse feedback capacitors 109 and 118 are connected from outputs of transistors 50 to the inverting input of operational amplifier 12. This enables a very low, less than 0.5% total harmonic distortion output without feedback from output stage 80. Likewise, there is enabled a high phase margin, and thus extreme stability, up to the megacycle range and up to a point where the amplifier has unity gain. Actually, a high degree of inverse feedback is employed via resistor 114 as described above, the feedback providing a very high dampening factor (e.g., on the order of 500) and thus achieving a significantly reduced output impedance.

Figure 2:
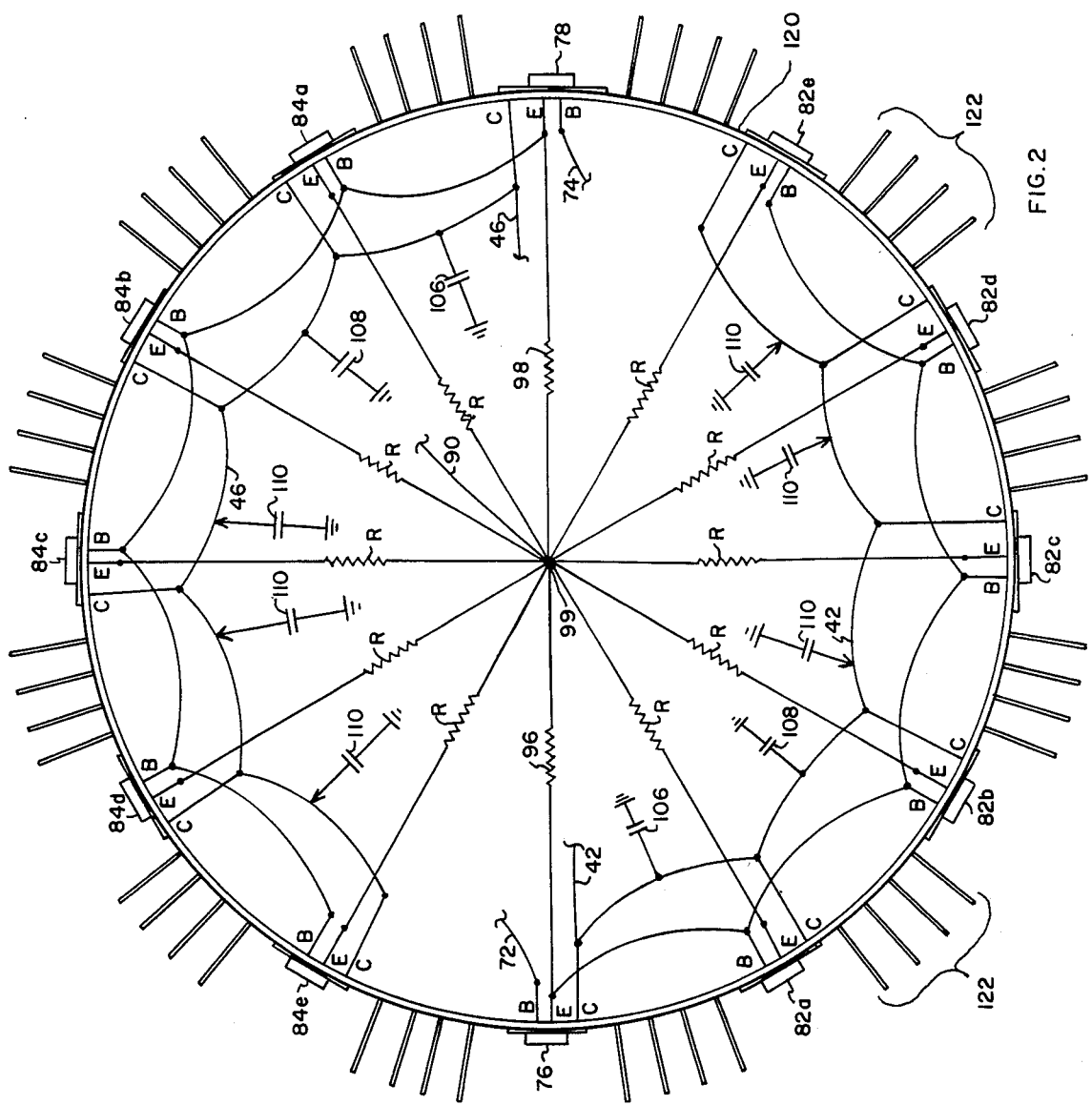
FIG. 2 is a plan view illustrating the output amplifier stage of the invention, portions of which are shown schematically.
Figure 3:
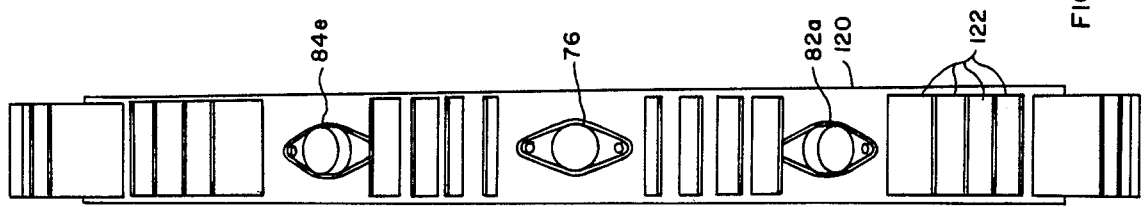
FIG. 3 is a side view of the output stage shown in FIG. 2.

FIGS. 2 and 3 illustrate, as one feature of this invention, a particular mechanical construction and arrangement of components for the output stage of applicant's amplifier. The output transistors 82a–82e and 84a–84e are mounted on a circular metal heat sink 120, having heat radiating fins 122 positioned between adjacent transistors. As one feature of this arrangement, the emitter leads are of identical length and are maintained as short as possible. This enables the distributed inductance, capacitance and resistance to be equal and thus load evenly shared by the transistors. Beyond this, the circular construction permits general symmetry of interconnections which enhances the operation of the amplifier.

By virtue of the total system of the invention as described, and the extremely small phase shift through the amplifier, and the fact that there is achieved essentially identical (and small) throughput delays of all frequencies, the amplifier provides an unusual degree of clarity and purity of reproduction. Thus, the relationship between harmonic frequencies and their fundamentals are maintained fixed, and sounds which may be rich in harmonics are faithfully reproduced. Beyond its employment for audio applications, the amplifier is ideally suited for a wide range of other applications, including industrial, space and military applications, anywhere a transducer must be driven by an amplified signal in accordance with the characteristics herein described.

What is claimed is:

1. A high frequency audio frequency amplifier comprising:

an operational amplifier having an inverting input, a non-inverting input, a positive bias port, a negative bias port and an output, the non-inverting input being a signal input;

a positive potential bias source having a reference terminal and a positive terminal;

a negative potential bias source having a negative terminal and a reference terminal common with said reference terminal of said positive potential bias source;

a first current amplifier having an input coupled between said positive bias terminal and said positive bias port of said operational amplifier and having a first current amplified output;

a second current amplifier having an input coupled between said negative bias terminal and said negative bias port of said operational amplifier and having a second current amplified output;

a first transistor amplifying circuit comprising a first transistor, an amplifier output terminal, a first emitter resistor connected between said amplifier output terminal and the emitter of said first transistor, and the output of said first current amplifier being connected as an input to the base-emitter circuit of said first transistor through said emitter resistor to said amplifier output terminal, and the collector of said first transistor being connected to said positive terminal;

a second transistor amplifying circuit comprising a second transistor of opposite polarity type to said first transistor, a second emitter resistor connected between said amplifier output terminal and the emitter of said second transistor, and the output of said second current amplifier being connected as an input through the base-emitter circuit of said second transistor through said second emitter resistor to said amplifier output terminal;

a first power amplifier comprising at least one third transistor having its input connected to the emitter of said first transistor and its collector connected to said positive terminal, and a third emitter resistor connected between the emitter of said third transistor and said amplifier output terminal;

a second power amplifier comprising at least one fourth transistor of opposite polarity type to said third transistor and having its input connected to the emitter of said second transistor and having its collector connected to said negative terminal, and a fourth emitter resistor connected between the emitter of said fourth transistor and said amplifier output terminal, the combined outputs of said first and second power amplifiers appearing between said amplifier output terminal and said reference terminal;

a temperature compensating current control comprising a fifth transistor connected in emitter-to-collector configuration and between the bases of said first and second transistors, and a plurality of serially connected diodes connected in a forward mode from the base of one of said first and second transistors to the base of said fifth transistor;

a negative feedback circuit comprising a feedback resistor connected between said amplifier output terminal and said inverting input of said operational amplifier, a first capacitor connected between the base of said first transistor and the inverting input of said operational amplifier, and a second capacitor connected between the base of said second transistor and the inverting input of said operational amplifier; and a plurality of capacitors including a first plurality of capacitors in turn including capacitors of different capacitances connected between said positive terminal and said reference terminal, and a second plurality of capacitors, including capacitors of different capacitances connected between said negative terminal and said reference terminal.

2. An amplifier as set forth in claim 1 wherein said capacitors connected between said reference terminal and said positive and negative terminals include capacitors connected to points on said terminals at which there appears a voltage peak arising from a standing wave arising out of spurious oscillation.

3. An amplifier as set forth in claim 1 further comprising a first voltage level shifter coupled between said positive bias port of said operational amplifier and said first current amplifier, and a second voltage shifter connected between the negative bias port of said operational amplifier and said second current amplifier.

4. An amplifier as set forth in claim 3 wherein said capacitors include capacitors connected between said reference terminal and power terminal, including capacitors connected to points on said power terminal at which there appears a voltage peak arising from a standing wave arising out of spurious oscillation.

5. An amplifier as set forth in claim 4 further comprising a first voltage limiter connected between said amplifier output terminal and the base of said first transistor, and a second voltage limiter connected between said amplifier output terminal and the base of said second transistor.

6. An amplifier as set forth in claim 5 further comprising a first diode connected in a reverse bias mode between said amplifier output terminal and said positive terminal, and a second diode connected in a reverse bias mode between said amplifier output terminal and said negative terminal.

7. An amplifier as set forth in claim 6 further comprising a first overload voltage indicator connected between the emitter of said third transistor and said amplifier output terminal, and a second overload voltage indicator connected between the emitter of said fourth transistor and said amplifier output terminal.

8. A high frequency audio frequency amplifier comprising:

an input amplifier having an inverting input, a non-inverting input, a positive bias port, a negative bias port and an output, the non-inverting input being a signal input;

a positive potential bias source having a reference terminal and a positive terminal;

a negative potential bias source having a negative terminal and a reference terminal common with said reference terminal of said positive potential bias source;

a first current amplifier having an input coupled between said positive bias terminal and said positive bias port of said input amplifier and having a first current amplified output;

a second current amplifier having an input coupled between said negative bias terminal and said negative bias port of said input amplifier and having a second current amplified output;

a first transistor amplifying circuit comprising a first transistor, an amplifier output terminal, a first emitter resistor connected to the emitter of said first transistor, the output of said first current amplifier being connected as an input to the base of said first transistor, the collector of said first transistor being connected to said positive terminal;

a second transistor amplifying circuit comprising a second transistor of opposite polarity type to said first transistor, a second emitter resistor connected between the emitter of said second transistor and the first emitter resistor, the output of said second current amplifier being connected as an input to the base of said second transistor;

a first power amplifier comprising at least one third transistor having its input connected to the emitter of said first transistor and its collector connected to said positive terminal, and a third emitter resistor connected between the emitter of said third transistor and said amplifier output terminal;

a second power amplifier comprising at least one fourth transistor of opposite polarity type to said third transistor and having its input connected to the emitter of said second transistor and having its collector connected to said negative terminal, and a fourth emitter resistor connected between the emitter of said fourth transistor and said amplifier output terminal, the combined outputs of said first and second power amplifiers appearing between said amplifier output terminal and said reference terminal;

a temperature compensating current control comprising a fifth transistor connected in emitter-to-collector configuration and between the bases of said first and second transistors, and current conducting means connected from the base of one of said first and second transistors to the base of said fifth transistor;

a negative feedback circuit comprising a feedback resistor connected between said amplifier output terminal and said inverting input of said input amplifier, a first capacitor connected between the base of said first transistor and the inverting input of said input amplifier, and a second capacitor connected between the base of said second transistor and the inverting input of said input amplifier; and a plurality of capacitors, including a first plurality of capacitors in turn including capacitors of different capacitances connected between said positive terminal and said reference terminal, and a second plurality of capacitors, including capacitors of different capacitances connected between said negative terminal and said reference terminal.

9. An amplifier as set forth in claim 8 wherein said capacitors connected between said reference terminal and said positive and negative terminals include capacitors connected to points on said terminals at which there appears a voltage peak arising from a standing wave arising out of spurious oscillation.

* * * * *